(12) United States Patent
Ogimoto

(10) Patent No.: US 6,857,182 B1
(45) Date of Patent: Feb. 22, 2005

(54) MOUNTING SYSTEM FOR MOUNTING AN ELECTRONIC COMPONENT ON A SUBSTRATE

(75) Inventor: Shinichi Ogimoto, Ebina (JP)

(73) Assignee: Shibaura Mechatronics Corporation, Yokohama (JP)

( * ) Notice: Subject to any disclaimer, the term of this patent is extended or adjusted under 35 U.S.C. 154(b) by 0 days.

(21) Appl. No.: 09/573,169

(22) Filed: May 19, 2000

(30) Foreign Application Priority Data

May 20, 1999 (JP) .......................................... 11-140757

(51) Int. Cl.[7] .............................................. H05K 3/30
(52) U.S. Cl. ......................... 29/832; 29/739; 29/740; 29/759; 29/833; 29/720; 700/213; 438/7
(58) Field of Search ...................... 29/720, 739, 740, 29/759, 833, 832; 700/213; 438/7

(56) References Cited

U.S. PATENT DOCUMENTS 5,858,806 A * 1/1999 Nishida ........................ 438/7

6,230,393 B1 * 5/2001 Hirano et al. .................. 29/740

* cited by examiner

*Primary Examiner*—Carl J. Arbes
*Assistant Examiner*—Tim Phan
(74) *Attorney, Agent, or Firm*—Oblon, Spivak, McClelland, Maier & Neustadt, P.C.

(57) ABSTRACT

A mounting system for mounting an electronic component on a substrate includes a component identifying apparatus that identifies an electronic component to be mounted on the substrate. The component identifying apparatus includes a holding mechanism that holds the electronic component, a color-perceptive sensor that perceives a color of a predetermined region on the electronic component, and a data processor that identifies the electronic component on the basis of the color perceived by the color-perceptive sensor. The mounting system also includes a controller that controls an electronic component mounting operation on the basis of a result of identification obtained by the component identifying apparatus. The component identifying apparatus carries out the identification of the color of the predetermined region on the electronic component before the electronic component is mounted on the substrate, and the controller executes an operation to cause the electronic component mounting operation to be interrupted when the electronic component is not identified to be a desired one.

6 Claims, 4 Drawing Sheets

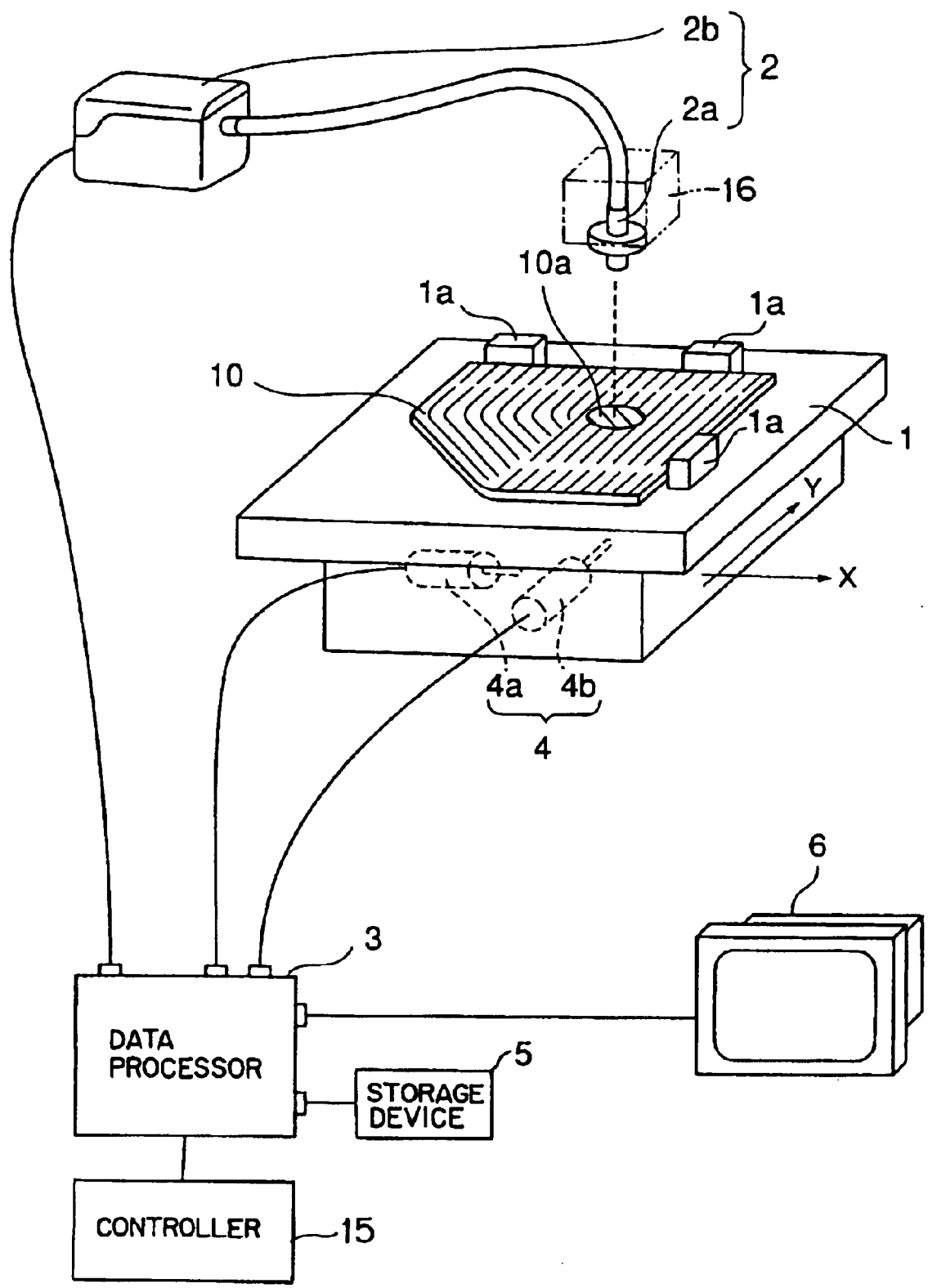
F I G. 1

MOUNTING SYSTEM FOR MOUNTING AN ELECTRONIC COMPONENT ON A SUBSTRATE

CROSS REFERENCE TO RELATED DOCUMENT

The present application claims the benefit of Japanese application, JP11-140,757, which was filed on May 20, 1999.

BACKGROUND OF THE INVENTION

1. Field of the Invention

The present invention relates to a mounting system and a mounting method to be applied to fabricating flat panel displays, typically, liquid crystal panels. More particularly, the present invention relates to a component identifying apparatus for identifying the type and lying position (feed position) of an electronic component to be mounted on a substrate.

2. Description of the Related Art

Generally, mounting systems that mount electronic components formed in films (hereinafter referred to as "film electronic components") on a glass substrate are employed in fabricating flat panel displays, such as liquid crystal displays. Such a mounting system, for example, includes a film electronic component feed device, a bonding member applying device, a bonding device, a substrate handling device and a substrate carrying device for carrying substrates between those devices. In the mounting system, the film electronic component feed device feeds a film electronic component. Then, the bonding member applying device applies an anisotropic conductive film (ACF) to the leads of the film electronic component, and the film electronic component is transferred to the bonding device. A glass substrate fed by the substrate handling device is set in place on the bonding device by the substrate carrying device. The displacement of the film electronic component relative to the glass substrate is detected by using a camera, the position of the film electronic component relative to the glass substrate is corrected, and the leads of the film electronic component is bonded to electrodes formed on the glass substrate through the ACF using a thermo compression bonding tool. After the film electronic v component has been thus mounted on the glass substrate, the substrate handling device transfers the glass substrate to the next processing station, and carries a new glass substrate to the bonding device.

Generally, the mounting system needs to mount film electronic components of a plurality of different types greatly differing from each other in size, mass and the like on a glass substrate.

Accordingly, it often occurs, when feeding a film electronic component to the mounting system, that a wrong film electronic component is fed or a film electronic component is fed in a wrong lying position and, consequently, the yield of product is liable to be reduced.

A component identifying method proposed to solve such problems determines whether a film electronic component to be mounted on a glass substrate is a correct one on the basis of the external shape of the film electronic component. FIG. 4 shows a component identifying apparatus for carrying out this component identifying method. As shown in FIG. 4, the component identifying apparatus is provided with a sensing unit 20 having a plurality of sensors 21 arranged in rows and columns. The external shape of a film electronic component 10 is estimated from detection signals provided by the sensors 21 to determine whether or not the film electronic component 10 is a desired one to be mounted on a glass substrate.

Since this known component identifying apparatus identifies the film electronic component 10 by its external shape, the known component identifying apparatus is unable to discriminate film electronic components 10 having similar external shapes stably from each other.

The positions of the sensors 21 of the known component identifying apparatus must be finely adjusted according to the external shape of the film electronic component 10. Therefore, when the known component identifying apparatus is applied to mounting film electronic components 10 of a plurality of different types on a substrate, the work for adjusting the positions of the sensors 21 takes much time.

Although the known component identifying apparatus does not have any particular difficulty in correctly identifying an asymmetrical film electronic component 10 as shown in FIG. 5A, the known component identifying apparatus mistakenly decides that a desired film electronic component 10 is fed correctly, in spite of being fed with the wrong side of the film electronic component 10 being faced up, when the film electronic component 10 is an axisymmetrical one as shown in FIG. 5B.

SUMMARY OF THE INVENTION

Accordingly, it is an object of the present invention to provide a component identifying apparatus capable of simply and stably identifying the type and lying position of a film electronic component, a mounting system employing the component identifying apparatus and a mounting method employing the component identifying apparatus.

The present invention provides a component identifying apparatus for identifying an electronic component to be mounted on a substrate, including a holding mechanism for holding the electronic component, a color-perceptive sensor capable of perceiving the color of the electronic component held by the holding mechanism, and a data processor capable of identifying the electronic component on the basis of the color perceived by the color-perceptive sensor.

Preferably, the component identifying apparatus further includes a storage device for storing data on a plurality of identification colors used for respectively identifying a plurality of electronic components of different types. The data processor may selectively determine an identification color used for identifying the type of an electronic component to be mounted on the substrate on the basis of the data stored in the storage device, and identifies the electronic component on the basis of the identification color and the color perceived by the color-perceptive sensor.

Preferably, the component identifying apparatus further includes a holding mechanism moving unit for moving the holding mechanism and the data processor controls the holding mechanism moving unit to move the holding mechanism so as to enable the color-perceptive sensor to perceive the color of the predetermined region on the electronic component. Also, it is preferred that the component identifying apparatus further includes a sensor moving unit for moving the color-perceptive sensor, and the data processor controls the sensor moving unit to move the color-perceptive sensor so as to enable the color-perceptive sensor to perceive the color of the predetermined region on the electronic component. Preferably, the component identifying apparatus further includes a region data storage device that stores data on a plurality of predetermined regions on a plurality of electronic components of different types as data on color checking positions, the data processor selectively determines a color checking position for an electronic component of a type on the basis of the data stored in the region data storage device, and the holding mechanism moving unit or the sensor moving unit is controlled to move the holding mechanism or the color-perceptive sensor so as to enable the color-perceptive sensor to perceive the color of the predetermined region on the electronic component.

The present invention provides a mounting system including the foregoing component identifying apparatus, and a controller that controls an electronic component mounting operation on the basis of a result of identification obtained by the component identifying apparatus.

The present invention provides further a mounting method of mounting an electronic component on a substrate, including the steps of holding an electronic component by a holding mechanism included in a component identifying apparatus, perceiving the color of the electronic component held by the holding mechanism by a color-perceptive sensor to identify the electronic component on the basis of the perceived color, and controlling an electronic component mounting operation on the basis of the result of identification of the electronic component.

Since the electronic component is identified by the color of the predetermined region on the electronic component, electronic components respectively having similar external shapes can be stably discriminated from each other. Operations for finely adjusting the positions of sensors according to the external shapes of electronic components are unnecessary and hence time necessary for the positional adjustment of sensors can be reduced. Even if the electronic component to be mounted on the substrate has an axisymmetrical shape, the lying position of the electronic component can be properly recognized on the basis of the colors of predetermined regions on the opposite surfaces of the electronic component.

According to the present invention, electronic components can be stably discriminated from each other since the color of the predetermined region on an electronic component can be properly perceived at a predetermined color checking position by moving the holding mechanism by the holding mechanism moving unit or by moving the color-perceiving sensor by the sensor moving unit.

According to the present invention, identification colors used for identifying electronic components of different types and color checking positions for electronic components of different types are stored in the storage device. Therefore, when an electronic component of a new type is to be mounted on the substrate, only data on the electronic component of the new type needs to be entered and hence time necessary for the positional adjustment of the sensor can be reduced.

BRIEF DESCRIPTION OF THE DRAWINGS

Preferred embodiments of the present invention will be described hereinafter with reference to the accompanying drawings, in which:

FIG. 1 is a perspective view of assistance in explaining a component identifying apparatus and a mounting system embodying the present invention;

DESCRIPTION OF THE PREFERRED EMBODIMENTS

Figure 2:
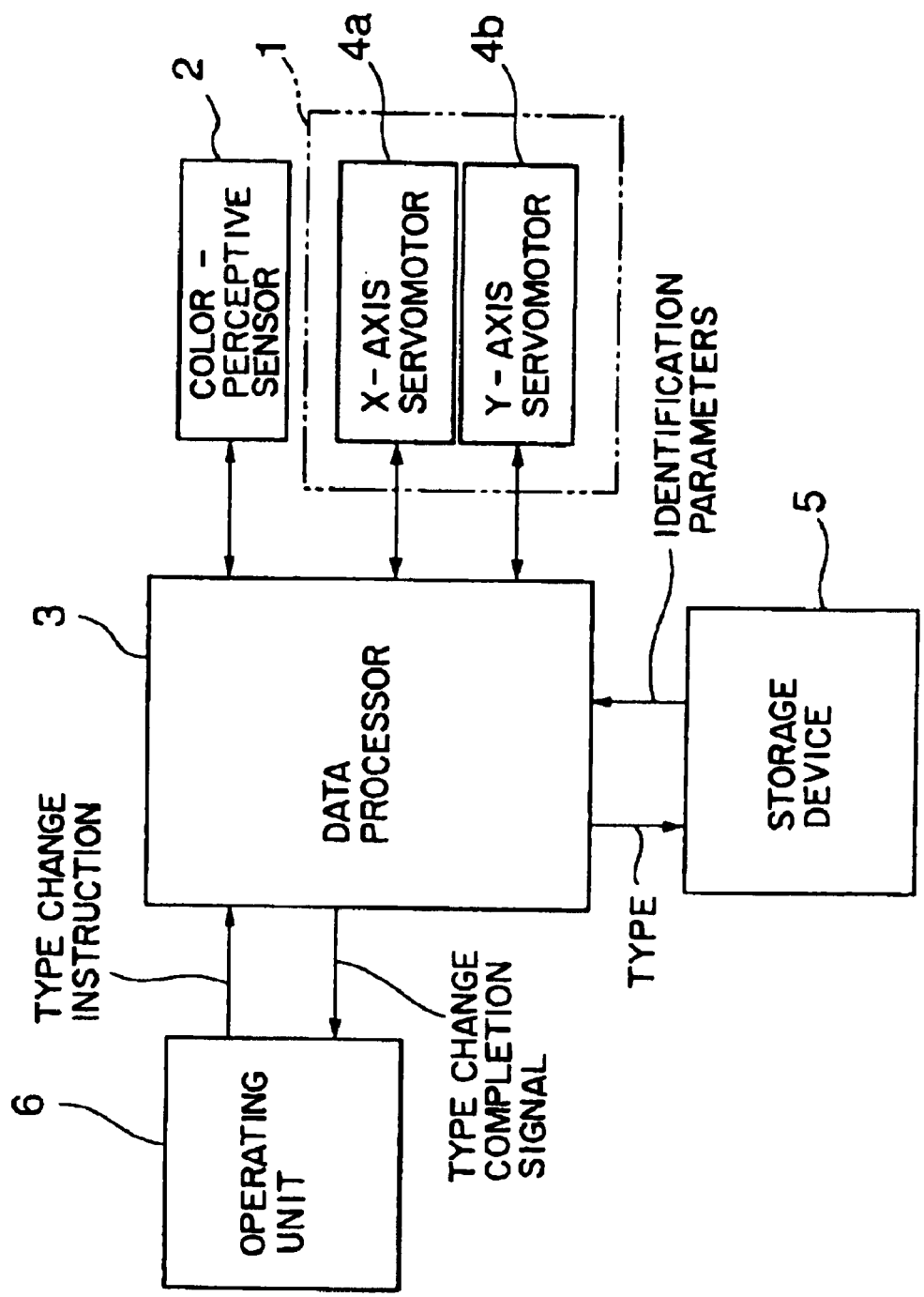
FIG. 2 is a block diagram of the component identifying apparatus shown in FIG. 1.

A component identifying apparatus in a preferred embodiment according to the present invention is incorporated into a mounting system for mounting film electronic components on a glass substrate. Referring to FIGS. 1 and 2, the component identifying apparatus has a carrying stage (holding mechanism) 1 supporting a film electronic component 10 thereon, a color-perceptive sensor 2 for perceiving the color of a predetermined region 10a on the film electronic component 10, and a data processor 3 capable of identifying the type and lying position of the film electronic component 10 on the basis of the color of the predetermined region 10a. A region on the film electronic component 10 colored in a color used for discriminating the film electronic component 10 from electronic components of other types is used as the predetermined region 10a.

The carrying stage 1 is provided with a plurality of locating blocks 1a to locate the film electronic component 10. The film electronic component 10 can be fixedly held on the upper surface of the carrying stage 1 by suction. A stage moving unit (holding mechanism moving unit) 4 for moving the carrying stage 1 in directions along the X- and the Y-axis is disposed under the carrying stage 1 and is provided with an X-axis servomotor 4a and a Y-axis servomotor 4b.

The color-perceptive sensor 2 has a sensing head 2a disposed above the carrying stage 1, and an amplifier 2b.

The data processor 3 is connected to the X-axis servomotor 4a and the Y-axis servomotor 4b of the stage moving unit 4, and the amplifier 2b of the color-perceptive sensor 2. The data processor 3 is connected also to a storage device 5 storing data on parameters including identification colors used for identifying film electronic components 10, color checking positions and color checking times for film electronic components 10 of different types, and an operating unit 6 for displaying instructions to the operator and receiving instructions from the operator. The data processor 3 selects an identification color, a color checking position and a color checking time specified for the type of the film electronic component 10, and controls the X-axis servomotor 4a and the Y-axis servomotor 4b on the basis of the selected color checking position to move the carrying stage 1 to perceive the color of the predetermined region 10a of the film electronic component 10 by the color-perceptive sensor 2 at the selected color checking position. The data processor 3 is able to determine whether or not the type and the lying position of the film electronic component 10 supported on the carrying stage 1 are desired ones on the basis of the selected color and the color of the predetermined region 10a on the film electronic component 10 perceived by the color-perceptive sensor 2 in the selected color checking time.

The data processor 3 is connected to a controller 15 for controlling the operations of the mounting system. The controller 15 controls the mounting operation of the packaging system for mounting the film electronic component 10 on the basis of a decision made by the data processor 3. More concretely, when the data processor 3 decides that the type and lying position of the film electronic component 10 are not desired ones, the controller 15 executes operations, for example, to make the mounting system interrupt a mounting procedure, to send the film electronic component 10 into a waste box or the like and to set the mounting system in a waiting state, or to mark the film electronic component 10 with a rejection mark.

The operation of the component identifying apparatus will be described hereafter. The operator starts the mounting system and enters data of the type of a film electronic component 10 to be mounted on a glass substrate by operating the operating unit 6. Then, the operating unit 6 gives a type changing command to the data processor 3. Upon the reception of the type changing command, the data processor 3 reads identification parameters including an identification color, a color checking position and a color checking time for the type specified by the operator by operating the operating unit 6 from the storage device 5 to use the identification parameters for identifying the film electronic component 10 to be mounted on the glass substrate.

An instruction prompting the operator to feed the film electronic component 10 is displayed on the operating unit 6. Then, the operator places the film electronic component 10 on the carrying stage. The film electronic component 10 is located by the locating blocks 1a and is held fixedly on the carrying stage 1 by suction.

After the film electronic component 10 has been thus fixedly held on the carrying stage 1, the operator operates the operating unit 6 to enter a signal indicating the completion of an operation for feeding the film electronic component 10. Then, the data processor 3 controls the X-axis servomotor 4a and the Y-axis servomotor 4b to move the carrying stage 1 to locate the predetermined region 10 a of the film electronic component 10 at a predetermined color checking position, and the color-perceptive sensor 2 perceives the color of the predetermined region 10a of the film electronic component 10. The data processor 3 compares the color of the predetermined region 10a perceived by the color-perceptive sensor 2 for a predetermined color checking time with the predetermined identification color to determine whether or not the film electronic component 10 is of a desired type and the film electronic component 10 is located in a desired lying position.

If the film electronic component 10 is not of the desired type or the film electronic component 10 is not fed in the desired lying position, the data processor 3 prompts the operator to feed another film electronic component 10. The result of the identifying operation of the data processor 3 is given to the controller 15 to stop the mounting system temporarily. When necessary, the controller 15 executes operations to make the mounting system eject the defective film electronic component 10 into a waste box or the like, to set the mounting system in a waiting state, or to mark the film electronic component 10 with a rejection mark.

When the film electronic component 10 is correct and is fed correctly, the data processor 3 gives a signal to the controller 15 that controls the operations of the mounting system. Upon the reception of the signal, the controller 15 controls the mounting system for operations to carry out sequentially, for example, known steps of applying an ACF to the leads of the film electronic component by a bonding member applying device, detecting the displacement of the film electronic component relative to the glass substrate by using a camera, correcting the position of the film electronic component relative to the substrate and bonding the leads of the film electronic component through the ACF to electrodes formed on the glass substrate by using a thermo compression bonding tool.

When the film electronic component 10 is changed for a film electronic component 10 of another type, data on the type of the new film electronic component 10 is entered by operating the operating unit 6, and then the foregoing procedure is repeated.

Figure 3A:
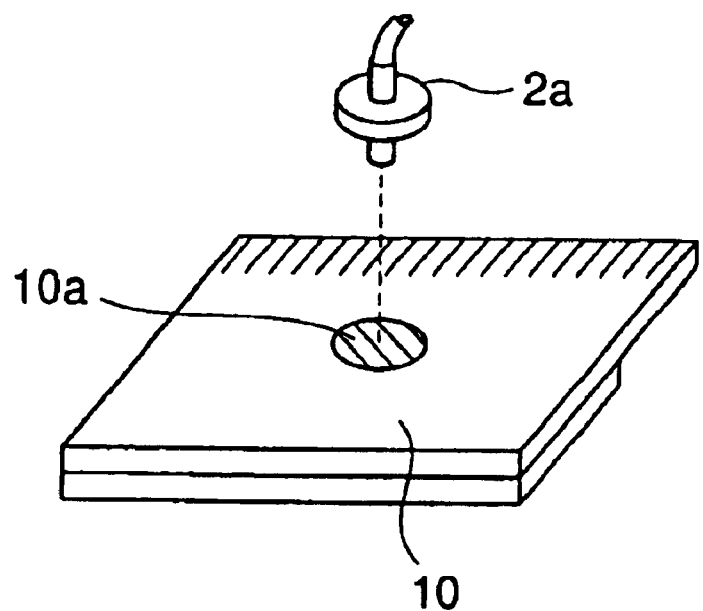
FIGS. 3A and 3B are perspective views of assistance in explaining a method of discriminating the opposite sides of an axisymmetrical film electronic component.
Figure 3B:
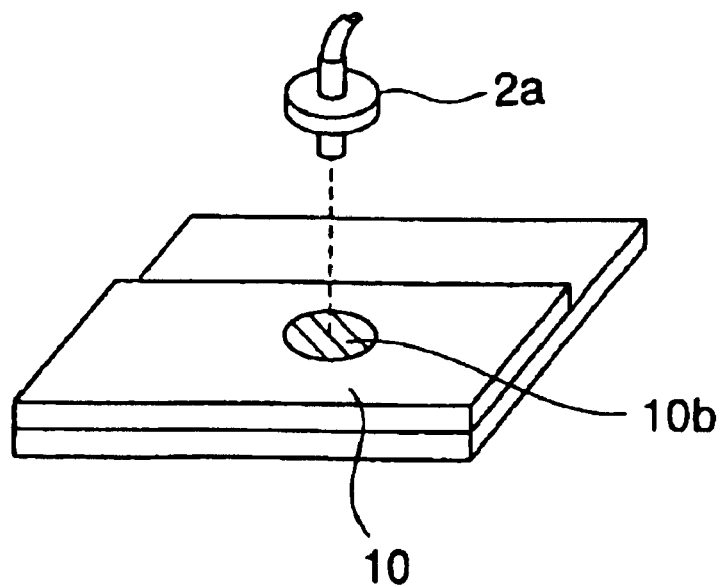
Figure 4:
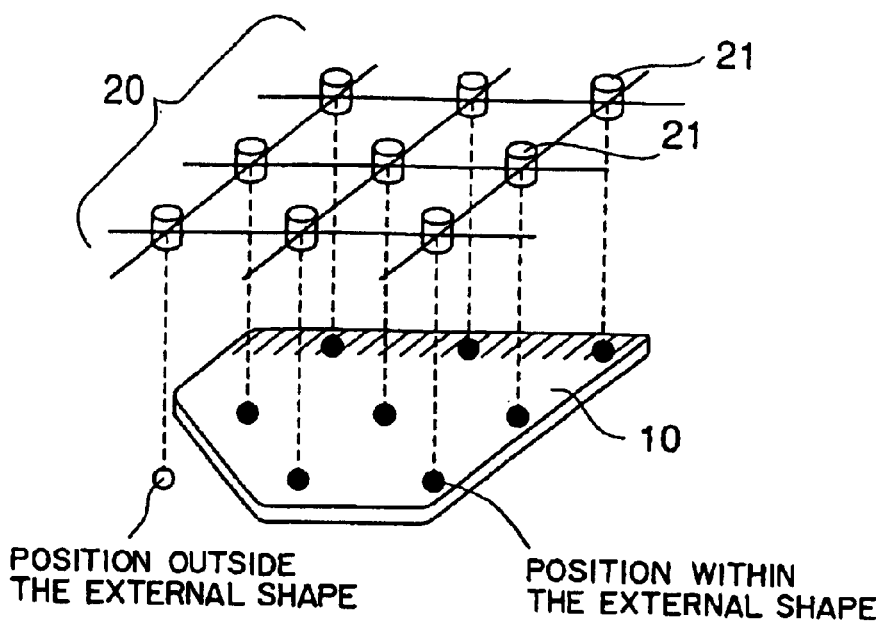
FIG. 4 is a schematic view of a known component identifying apparatus.
Figure 5A:
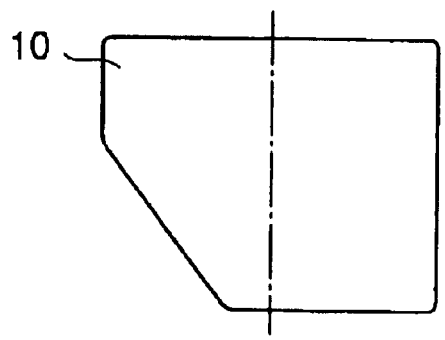
FIGS. 5A and 5B are views of assistance in explaining problems in the known component identifying apparatus.
Figure 5B:
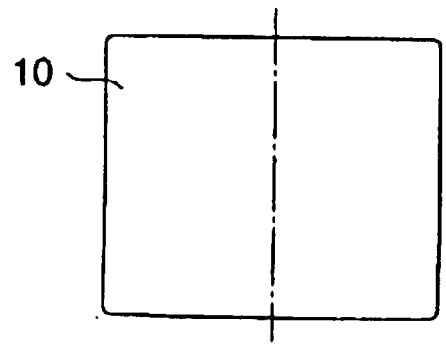

Thus, the type of the film electronic component 10 is identified by the color of the predetermined region of the film electronic component 10. Therefore, film electronic components of different types having similar external shapes can be stably discriminated from each other. Since the component identifying apparatus of the present invention does not need to perform any operation for the fine adjustment of the position of the sensor, which must be performed by the known component identifying apparatus shown in FIG. 4, time necessary for adjusting the position of the sensor can be reduced. Even if the film electronic component 10 to be mounted on the glass substrate has an axisymmetrical shape, the opposite sides of the film electronic component 10 can be discriminated from each other and the lying position of the film electronic component 10 can be known on the basis of the respective colors of predetermined regions on the opposite sides of the film electronic component 10. More concretely, the color, brown, for instance, of the predetermined region 10a on the right surface of the film electronic component 10 can be perceived by the color-perceptive sensor 2 when the film electronic component 10 is set in a correct lying position as shown in FIG. 3A. In contrast, the color, silver, for instance, of a predetermined region 10b on the reverse side of the film electronic component 10 can be perceived by the color-perceptive sensor 2 when the film electronic component 10 is set in a wrong lying position as shown in FIG. 3B.

Since the stage moving unit 4 moves the carrying stage 1 to position the film electronic component 10 at the predetermined color checking position, the color of an optimum region (predetermined region 10a) for the type of the film electronic component 10 can be perceived and hence the identification of the film electronic component 10 can be further stably achieved.

Since the data on parameters including identification colors used for identifying film electronic components 10, color checking positions and color checking times for film electronic components 10 of different types are stored in the storage device 5, the operator needs to enter only data on the type of a new film electronic component 10 when the new film electronic component 10 is to be mounted on the glass substrate. Consequently, the time necessary for adjusting the position of the sensor, which must be performed by the known component identifying apparatus shown in FIG. 4, can be reduced.

Although the component identifying apparatus in the foregoing embodiment uses the original color of the film electronic component 10 for identifying the film electronic component 10, the film electronic component 10 may be provided with a color mark of any suitable color, and the color mark may be perceived by the color-perceptive sensor 2 to identify the film electronic component 10.

Although the component identifying apparatus in the foregoing embodiment moves the carrying stage 1 by the stage moving unit 4, the component identifying apparatus may be additionally provided with a sensor moving unit 16, the color-perceptive sensor 2 may be moved by the sensor moving unit 16 to check the color of the predetermined region 10a of the film electronic component 10 by the color-perceptive sensor 2 at the color checking position.

In the component identifying apparatus in the foregoing embodiment, the working identification parameters are selected from those stored in the storage device 5 according to the data on the type of the film electronic component entered by operating the operating unit 6 by the operator. However, if the feeding sequence of film electronic components of different types is determined beforehand and the operator operates the operating unit 6 to feed a film electronic component 10 of a type specified by a feed instruction provided by the data processor 3, the identification parameters may be automatically changed by the data processor 3 when the data processor 3 gives the feed instruction to the operating unit 6 or when the operating unit 6 is operated to give a film electronic component feed completion signal to the data processor 3.

Although the component identifying apparatus uses the carrying stage 1 as the holding mechanism for holding the film electronic component 10, a carrying head capable of holding the film electronic component 10 by suction may be used instead of the carrying stage and the color of the predetermined region on the film electronic component 10 may be checked while the film electronic component 10 is being carried by the carrying head.

Although the invention has been described in its preferred embodiments with a certain degree of particularity, changes and variations may be made therein without departing from the scope and spirit of the invention.

What is claimed is:

1. A mounting system for mounting an electronic component on a substrate, comprising:
    a component identifying apparatus configured to identify an electronic component to be mounted on the substrate,
    said component identifying apparatus including
        a holding mechanism configured to hold the electronic component,
        a color-perceptive sensor configured to perceive a color of a predetermined region on the electronic component held by the holding mechanism, and
        a data processor configured to identify the electronic component on the basis of the color perceived by the color-perceptive sensor; and
    a controller configured to control an electronic component mounting operation on the basis of a result of identification obtained by the component identifying apparatus,
    wherein the component identifying apparatus carries out the identification of the color of the predetermined region on the electronic component before the electronic component is mounted on the substrate, and the controller executes an operation to cause the electronic component mounting operation to be interrupted when the electronic component is not identified by the component identifying apparatus to be a desired one.

2. The mounting system according to claim 1, said component identifying apparatus further comprising a storage device configured to store data on a plurality of identification colors used for respectively identifying a plurality of electronic components of different types,
    wherein the data processor is configured to selectively determine an identification color used for identifying a type of an electronic component to be mounted on the substrate on the basis of the data stored in the storage device, and to identify the electronic component on the basis of the identification color and the color perceived by the color perceptive sensor.

3. The mounting system according to claim 1, said component identifying apparatus further comprising a holding mechanism moving unit configured to move the holding mechanism,
    wherein the data processor is further configured to control the holding mechanism moving unit to move the holding mechanism so as to enable the color-perceptive sensor to perceive the color of the predetermined region on the electronic component.

4. The mounting system according to claim 3, said component identifying apparatus further comprising a region data storage device configured to store data on a plurality of predetermined regions respectively provided on a plurality of electronic components of different types as data on color checking positions,
    wherein the data processor is further configured to selectively determine a color checking position for an electronic component of a type on the basis of the data stored in the region data storage device and to control the holding mechanism moving unit to move the holding mechanism so as to enable the color-perceptive sensor to perceive the color of the predetermined region on the electronic component.

5. The mounting system according to claim 1, said component identifying apparatus further comprising a sensor moving unit configured to move the color-perceptive sensor,
    wherein the data processor is further configured to control the sensor moving unit to move the color-perceptive sensor so as to enable the color-perceptive sensor to perceive the color of the predetermined region on the electronic component.

6. The mounting system according to claim 5, said component identifying apparatus further comprising a region data storage device configured to store data on a plurality of predetermined regions respectively provided on a plurality of electronic components of different types as data on color checking positions,
    wherein the data processor is further configured to selectively determine a color checking position for an electronic component of a type on the basis of the data stored in the region data storage device, and to control the sensor moving unit to move the color-perceptive sensor so as to enable the color-perceptive sensor to perceive the color of the predetermined region on the electronic component.

* * * * *